(12) United States Patent
Maier et al.

(10) Patent No.: US 10,324,120 B2
(45) Date of Patent: Jun. 18, 2019

(54) ARRANGEMENT WITH A PLURALITY OF PERIPHERAL UNITS AND A SENSOR

(71) Applicant: Siemens Aktiengesellschaft, Munich (DE)

(72) Inventors: Willi Maier, Oppenau (DE); Norbert Rottmann, Landau (DE)

(73) Assignee: Siemens Aktiengesellschaft, Munich (DE)

( * ) Notice: Subject to any disclaimer, the term of this patent is extended or adjusted under 35 U.S.C. 154(b) by 113 days.

(21) Appl. No.: 15/414,903

(22) Filed: Jan. 25, 2017

(65) Prior Publication Data
US 2017/0219642 A1 Aug. 3, 2017

(30) Foreign Application Priority Data

Jan. 29, 2016 (EP) .................................... 16153428

(51) Int. Cl.
*G01R 27/16* (2006.01)
*G05B 19/042* (2006.01)
*G01R 1/20* (2006.01)

(52) U.S. Cl.
CPC ............ *G01R 27/16* (2013.01); *G01R 1/206* (2013.01); *G05B 19/042* (2013.01)

(58) Field of Classification Search
CPC ................................ G01R 27/16; G01R 1/206
See application file for complete search history.

(56) References Cited

U.S. PATENT DOCUMENTS

| 5,734,268 A | * | 3/1998 | Bockelman ............ G01R 27/28 324/601 |
| 6,845,416 B1 | * | 1/2005 | Chasmawala ....... H04L 12/4135 710/107 |
| 9,638,544 B2 | * | 5/2017 | Kondo .................... H04Q 9/00 |
| 2009/0096571 A1 | | 4/2009 | Onoshima et al. |

(Continued)

FOREIGN PATENT DOCUMENTS

| CN | 102203624 | 9/2011 |
| CN | 104995483 | 10/2015 |

(Continued)

OTHER PUBLICATIONS

Simatic "Dezentrale Peripherie F-Technik Dezentrales Peripheriesystem ET 200S Montage- und Bedienhandbuch, Aug. 2008, A5E00103684-07, Siemens AG; SIMATIC" Dezentrale Peripherie F-Technik Dezentrales Peripheriesystem ET 200S Montage- und Bedienhandbuch, Aug. 2008, A5E00103684-07, Siemens AG, pp. 2-242; 2008.

(Continued)

*Primary Examiner* — Tung X Nguyen
*Assistant Examiner* — Dominic E Hawkins
(74) *Attorney, Agent, or Firm* — Cozen O'Connor

(57) ABSTRACT

An arrangement includes a plurality of peripheral units and with a sensor, each of the plurality of peripheral units being provided with a connection for connecting the sensor to a supply voltage, includes a sensor input for connecting the sensor, and also includes a measuring resistor for acquiring a sensor current that represents a signal state, where a redundant acquisition and evaluation of the sensor current or a redundant operation of the sensor is permitted on the plurality of peripheral units via suitable measures.

11 Claims, 1 Drawing Sheet

(56) References Cited

U.S. PATENT DOCUMENTS

| | | | |
|---|---|---|---|
| 2009/0302317 A1* | 12/2009 | Okayasu | G01R 31/319 257/48 |
| 2011/0267078 A1 | 11/2011 | Eilersen | |
| 2014/0239994 A1* | 8/2014 | Alves Moreira | G01R 31/31905 324/754.03 |
| 2015/0301979 A1* | 10/2015 | Mishra | G06F 9/4498 710/106 |
| 2015/0338432 A1 | 11/2015 | Sasaki | |
| 2016/0259702 A1* | 9/2016 | Mishra | G06F 11/3051 |

FOREIGN PATENT DOCUMENTS

| | | | | |
|---|---|---|---|---|
| DE | 10358989 A1 | 8/2005 | | |
| EP | 2806316 A1 | 11/2014 | | |
| JP | 2007-058831 | 3/2007 | | |
| WO | WO 2005/059665 | 6/2005 | | |
| WO | WO-2005059665 A1 * | 6/2005 | | G05B 19/058 |

OTHER PUBLICATIONS

Office Action dated Nov. 5, 2018 issued in Chinese Patent Application No. 201710063356.3.

\* cited by examiner

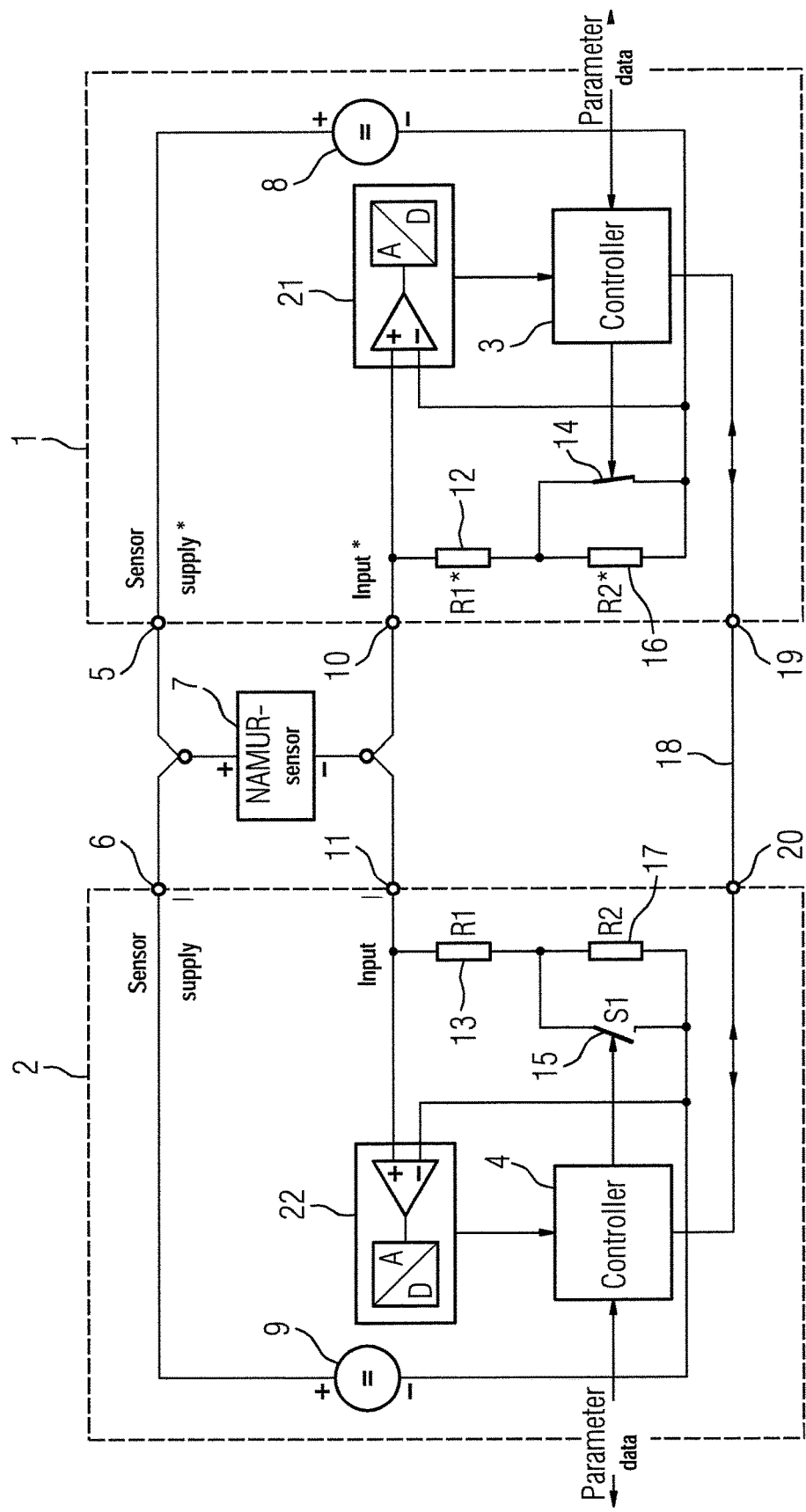

ARRANGEMENT WITH A PLURALITY OF PERIPHERAL UNITS AND A SENSOR

BACKGROUND OF THE INVENTION

1. Field of the Invention

The invention relates to an arrangement with a plurality of peripheral units and a sensor, where each of the peripheral units includes a connection for connecting the sensor to a supply voltage, includes a sensor input for connecting the sensor and also includes a measuring resistor for acquiring a sensor current that represents a signal state, and relates to a peripheral unit according which is suited to such an arrangement.

2. Description of the Prior Art

In the field of automation, high-availability solutions (H-systems), which are suited to reducing possible idling times of the plant to a minimum, are increasingly in demand. These H-systems conventionally have two automation devices that have a number of modules or programmable logic controllers, where both automation devices can access the peripheral units or decentralized peripherals connected to the automation devices and provided with a number of peripheral modules in read and/or write mode. To ensure that both automation devices can run in synchrony, these are synchronized at regular intervals.

Furthermore, it is frequently also desired in high-availability systems to redundantly operate two peripheral modules of a decentralized peripheral or two peripheral modules of two such decentralized peripherals. In the case that these peripheral modules are formed as digital input modules, an (individual) sensor is typically connected to both (partner) peripheral modules, where the decentralized peripherals are connected via a bus to an automation device, which has a number of modules, in the manner of a central or expansion device. However, in the case that the sensor is formed as what is known as a NAMUR sensor according to DIN 19234 that is widely used in process automation, it is not readily possible to operate this (individual) NAMUR sensor on two digital input modules simultaneously, because in this case inconsistent signal states would result on account of the impressed current supplied by the NAMUR sensor.

For instance, a peripheral unit formed as a digital input module and known from the Siemens handbook "Dezentrale Peripherie ET 200S, Digitales Elektronikmodul 4DI NAMUR" [Decentralized Peripheral System ET200S, Digital electronics module 4DI NAMUR], Edition March 2010, applies a supply voltage of 8.2 V to a connected NAMUR sensor, where different signal states "0", "1", "wire break" or "short-circuit" are mapped via currents impressed by the sensor. A current of less than 0.35 mA represents a wire break between the NAMUR sensor and digital input module, a current of 0.35 mA to 1.2 mA a signal state "0", a current of 2.1 mA to 7 mA a signal state "1", and a current of greater than 7 mA a short-circuited NAMUR sensor. The current flows via a low-impedance measuring resistor (shunt) of the digital input module and at this measuring resistor (1 kOhm) effects a voltage drop that is proportional to this impressed current, which maps or represents the signal state of the NAMUR sensor within the module.

In the case that the NAMUR sensor of the digital input module impresses a current of 2.4 mA, for instance, a voltage of 2.4 V drops at the measuring resistor, where this voltage drop is interpreted by the digital input module as signal state "1".

Conversely, in the case that the NAMUR sensor is connected simultaneously to two such digital input modules and operated, i.e., the sensor is connected to an input of each of these digital input modules, the measuring resistors of the modules are connected in parallel. As a result, the current of 2.4 mA impressed by the NAMUR sensor is divided proportionally, for instance, and therefore only drops 1.2 V at each of the two measuring resistors of the two modules. This voltage drop of 1.2 V is assessed by the digital input modules as signal state "0", which means that an incorrect signal state was "detected".

In order to be able to form a clear signal state during redundant operation, it is therefore absolutely imperative that each of the two digital input modules has to know the availability of its partner module at any point in time in order to correctly assess the acquired voltage. In order to effect this, one NAMUR sensor can therefore be provided for each digital input module or digital input unit, in order to ensure the high availability of NAMUR sensors.

SUMMARY OF THE INVENTION

In view of the foregoing, it is therefore an object of the invention to provide an arrangement that permits a redundant acquisition and assessment of the signal state of a sensor signal or which permits a redundant operation of the sensor on the at least two peripheral units. It is also an object of the invention to provide a peripheral unit that is suitable for an arrangement of this type.

These and other objects and advantages are achieved in accordance with the invention by an arrangement and peripheral unit, where it is advantageous, for instance, in the case that the peripheral units are formed as digital input units, for a NAMUR sensor not to have to be provided for each of the digital input units for a redundant acquisition and evaluation, e.g. of NAMUR signals. Only one NAMUR sensor has to be connected to the respective NAMUR input of the digital input units. The sensor input of one of the digital input units is connected with high impedance and the sensor input of the other digital input unit is connected with low impedance, as a result of which the sensor current flows almost entirely across the measuring resistor of the digital input unit that is connected with low impedance. The same voltage drop is acquired at both sensor inputs, assuming the same sensor supply voltage, so that both digital input units are able to detect the same signal state and identify a fault in the form of a wire break by way of the current flow, for instance. This ensures that in the case that one of the digital input units fails or one of these digital input units is removed from a controller ("pulling" the digital input unit), the NAMUR signal of the signal state of the NAMUR sensor is available at any time to the other digital input unit. In order to permit this, if the digital input unit connected with low impedance fails, then each of the digital input units is configured to generate or receive the switchover signal itself. In the case that one of the digital input units fails completely, the other digital input unit generates the switchover signal. In the case that one of the digital input units cannot acquire the sensor signal (wire break), the other digital input unit receives the switchover signal from the one digital input unit.

In an embodiment of the invention, each of the digital input units is also configured to receive a further switchover signal from a control unit. This ensures that the control unit, e.g., for setting a basic state, defines or parameterizes one of the digital input units as a master unit and the other as a slave unit. Here, the term "control unit" is to be defined in the overall context of this description such that it comprises all devices, facilities or systems, in other words in addition to, e.g., control units such as programmable logical controllers, automation devices, decentralized peripherals, processing computers, (industrial) computers and such, also drive controllers and similar, that are suitable for controlling, regulating and/or monitoring technical processes.

In a further embodiment of the invention, the switchover facility is configured to connect, using a switch, a bridgeable high-impedance resistor in series with the measuring resistor or to connect a low-impedance measuring resistor in parallel with a high-impedance resistor. As a result, a switchover from low to high impedance and from high to low impedance can be effected using simple circuitry.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention, its embodiments and its advantages are explained in more detail below on the basis of an exemplary embodiment with reference to the sole FIGURE of the drawing, in which:

The FIGURE shows a simplified representation of an arrangement with two digital input units for redundantly acquiring and assessing a NAMUR signal.

DETAILED DESCRIPTION OF THE EXEMPLARY EMBODIMENTS

The arrangement has two digital input units 1, 2, of which, in the present exemplary embodiment, the digital input unit 1 is preset as a master unit and the digital input unit 2 is preset as a slave unit. This presetting is predetermined by control unit (not shown here), which transmits corresponding parameters for setting a master or slave basic state to a controller 3, 4 of the digital input units 1, 2 in each case. The control unit can comprise a CPU unit of a programmable logic controller or a CPU unit of a decentralized peripheral having a number of units or modules, which exchanges information with the programmable logic controller via a bus link. The digital input units 1, 2, to which the sensor 7 is connected simultaneously, can naturally be units in this decentralized peripheral or in this programmable logic controller.

For an improved overview and for the sake of simplicity, only one channel of the digital input units 1, 2 is shown in the present example. Typically the digital input units 1, 2 have a plurality of channels, where a NAMUR or another sensor can be connected to each channel. Each of these digital input units 1, 2 has a connection 5, 6 for connecting a NAMUR sensor 7 to a supply voltage of 8.2 V, for instance, where direct voltage sources 8, 9 of the digital input units 1, 2 apply this supply voltage to the NAMUR sensor 7. Furthermore, each of the digital input units 1, 2 is provided with a sensor input 10, 11 for connecting the NAMUR sensor 7 and with a low-impedance measuring resistor 12, 13 for acquiring a sensor current that represents a signal state, which sensor current is impressed by the NAMUR sensor 7 onto the digital input units 1, 2 via the sensor inputs 10, 11. Both digital input units 1, 2 furthermore each have a switchover facility, which permits the respective input 10, 11 to be connected with high impedance. In the present example, for this purpose provision is made in each case for a controllable switch 14, 15 which is connected in series with the respective low-impedance measuring resistor 12, 13 and for a high-impedance resistor 16, 17 which is connected in parallel thereto. The resistors are dimensioned in a practical exemplary embodiment of the invention such that the resistance value of the respective high-impedance resistors 16, 17 amounts to 100 times the resistance value of the respective low-impedance measuring resistor 12, 13. In the case that 1 kOhm measuring resistors are used for instance, 100 kOhm resistors are therefore to be provided for the switchover facilities. The switchover facility can also be realized such that a low-impedance resistor which can be connected via a controllable switch is arranged in parallel to a high-impedance resistor (e.g. 100 kOhm).

The switches 14, 15 are each actuated as a function of a switchover or control signal guided by way of a communication line 18 or as a function of a further switchover or control signal for presetting the respective digital input unit as a master or slave unit. For instance, during the acquisition of the sensor current, the digital input unit 1 indicates its current state (master state) to the digital input unit 2 by way of the control signal generated by the controller 3. This exchange of information via the communication line 18, which connects the connections 19, 20 of the digital input units 1, 2, means that each digital input unit 1, 2 knows the state of the respective other digital input unit 1, 2.

The function and mode of operation of the arrangement are described in more detail below. Here, as explained, the digital input unit 1 is preset as a master unit and the digital input unit 2 is preset as a slave unit, where for the purpose of this presetting the respective controllers 3, 4 each generate a control signal for actuating the switches 14, 15 based on the parameters transmitted by the control unit. In order to preset the digital input unit 1 as a master unit, the controller 3 generates a control signal to close the switch 14. Conversely, the controller 4 generates a control signal to open the switch 15, as a result of which the digital input unit 2 takes over the slave function.

These preset switch settings of the switches 14, 15, on the one hand, cause the high-impedance resistor 17 to be connected in series with the low-impedance measuring resistor 13 of the slave unit 2 and, on the other hand, cause the high-impedance resistor 16 of the master unit 1 to be bridged, which means that the sensor current flows almost entirely across the low-impedance measuring resistor 12 of the master unit 1 of the digital input unit 1. The same voltage drop is acquired at both sensor inputs 10, 11, so that both digital input units 1, 2 detect the same signal state (internally).

Based on the preset switch settings, which define or set the digital input unit 1 as a master unit and the digital input unit 2 as a slave unit, the following scenarios are explained in relation to the arrangement with the NAMUR sensor 7 connected simultaneously to the digital input units 1, 2:

A) Remove the slave unit (digital input unit 2):

The digital input unit 1 (master unit) still acquires the current flow, determines the signal state and transmits this to the control unit. The control unit identifies, in the absence of a signal of the controller 4, that the slave unit is no longer present in the arrangement.

B) Remove the master unit (digital input unit 1):

As a result of the communication line 18 being interrupted in the absence of the master unit, the switch 15 of the digital unit 2 is closed using the controller 4. The digital input unit 2 therefore takes over the current flow and thus becomes the master unit. The digital input unit 2 now determines the signal state and transmits this to the control unit. The control unit identifies, in the absence of a signal of the controller 3, that the digital input unit 1 is no longer present in the arrangement.

C) Wire break between the slave unit (digital input unit 2) and the NAMUR sensor 7:

The digital input unit 2 identifies the wire break by virtue of the digital input unit 2 failing to measure any voltage at the input 11 which, in accordance with the NAMUR definition, indicates an invalid signal. This state is transmitted via a suitable item of diagnostic information to the control unit. The master unit (digital input unit 1) also supplies the valid signal state or the valid status.

D) Wire break between the master unit (digital input unit 1) and the NAMUR sensor 7:

The digital input unit 1 identifies the wire break by the absence of the current flow and transmits a switchover signal via the communication line 18, such that the digital input unit 1 "disconnects current from" the communication line 18. The controller 4 of the digital input unit 2 then closes the switch 15, as a result of which the digital input unit 2 takes over the master function and transmits the signal state of the NAMUR sensor 7 to the control unit. The digital input unit 1 (previously master unit) notifies the control unit of the wire break using a suitable diagnostic message or item of diagnostic information.

E) Wire break in the NAMUR sensor 7 or between the connections 5, 6 and the NAMUR sensor 7:

Both digital input units 1, 2 simultaneously identify the wire break (no current flow), where the master unit or both digital input units 1, 2 notify the control unit of a failure of the NAMUR sensor 7 by way of a suitable item of diagnostic information.

F) Short-circuit of the NAMUR sensor 7:

The short-circuit current (>7 mA) flows almost entirely across the measuring resistor 12 of the digital input unit 1 (master unit); the same voltage drop is acquired at the inputs 10, 11 of the digital input units 1, 2 so that both digital input units 1, 2 detect the same signal state (short-circuit of the NAMUR sensor 7). This detected signal state is transmitted to the control unit via the controller 3 of the digital input unit 1 (master unit).

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those element steps which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. An arrangement comprising:
  a sensor; and
  a plurality of peripheral units, each of the plurality of peripheral units including:
    a connection for connecting the sensor to a supply voltage,
    a sensor input for connecting the sensor, and
    a low-impedance measuring resistor for acquiring a sensor current which represents a signal state;
  wherein the plurality of peripheral units are connected to one another via a communication line; and
  wherein each of the peripheral units includes a switchover facility, which connect the sensor input with low or high impedance as a function of a switchover signal transmitted over the communication line.

2. The arrangement as claimed in claim 1, wherein each of the plurality of peripheral units is configured to receive a further switchover signal from a control unit.

3. The arrangement as claimed in claim 1, wherein the switchover facility is configured to, using a switch, one of (i) connect a bridgeable high-impedance resistor in series with the low-impedance measuring resistor and (ii) connect the low-impedance measuring resistor in parallel with a high-impedance resistor.

4. The arrangement as claimed in claim 2, wherein the switchover facility is configured to, using a switch, one of (i) connect a bridgeable high-impedance resistor in series with the low-impedance measuring resistor and (ii) connect the low-impedance measuring resistor in parallel with a high-impedance resistor.

5. The arrangement as claimed in claim 1, wherein one peripheral unit of the plurality of peripheral units is connected with high impedance if another peripheral unit of the plurality of peripheral unit is connected with low impedance.

6. The arrangement as claimed in claim 2, wherein one peripheral unit of the plurality of peripheral units is connected with high impedance if another peripheral unit of the plurality of peripheral unit is connected with low impedance.

7. The arrangement as claimed in claim 3, wherein one peripheral unit of the plurality of peripheral units is connected with high impedance if another peripheral unit of the plurality of peripheral unit is connected with low impedance.

8. A peripheral unit for an arrangement, comprising:
  a connection for connecting a sensor to a supply voltage;
  a sensor input for connecting the sensor; and
  a low-impedance measuring resistor for acquiring a sensor current that represents a signal state;
  wherein the peripheral unit includes a connection for connecting a communication line; and
  wherein the peripheral unit includes a switchover facility connected in series with the low-impedance measuring resistor, said switchover facility being configured to connect the sensor input with low or high impedance as a function of a switchover signal transmitted over the communication line.

9. The peripheral unit as claimed in claim 8, wherein the peripheral unit is configured to receive a further switchover signal from a control unit.

10. The peripheral unit as claimed in claim 8, wherein the switchover facility is configured, using a switch, to one of (i) connect a bridgeable high-impedance resistor in series with the low-impedance measuring resistor and (ii) connect the low-impedance measuring resistor in parallel with a high-impedance resistor.

11. The peripheral unit as claimed in claim 9, wherein the switchover facility is configured, using a switch, to one of (i) connect a bridgeable high-impedance resistor in series with the low-impedance measuring resistor and (ii) connect the low-impedance measuring resistor in parallel with a high-impedance resistor.

\* \* \* \* \*